United States Patent
Liu et al.

(10) Patent No.: US 9,356,171 B2
(45) Date of Patent: May 31, 2016

(54) METHOD OF FORMING SINGLE-CRYSTAL SEMICONDUCTOR LAYERS AND PHOTOVALTAIC CELL THEREON

(75) Inventors: Jifeng Liu, Hanover, NH (US); Xiaoxin Wang, Hanover, NH (US)

(73) Assignee: THE TRUSTEES OF DARTMOUTH COLLEGE, Hanover, NH (US)

(*) Notice: Subject to any disclaimer, the term of this patent is extended or adjusted under 35 U.S.C. 154(b) by 356 days.

(21) Appl. No.: 13/401,206

(22) Filed: Feb. 21, 2012

(65) Prior Publication Data
US 2013/0186455 A1    Jul. 25, 2013

Related U.S. Application Data

(60) Provisional application No. 61/590,660, filed on Jan. 25, 2012.

(51) Int. Cl.
*H01L 31/0368* (2006.01)
*C30B 1/02* (2006.01)
*C30B 29/06* (2006.01)
(Continued)

(52) U.S. Cl.
CPC .......... *H01L 31/0368* (2013.01); *C30B 1/02* (2013.01); *C30B 1/023* (2013.01); *C30B 29/06* (2013.01); *H01L 31/03682* (2013.01); *H01L 31/076* (2013.01); *H01L 31/1872* (2013.01);
(Continued)

(58) Field of Classification Search
CPC .................................................. H01L 21/2026
USPC ....................................................... 136/255
See application file for complete search history.

(56) References Cited

U.S. PATENT DOCUMENTS 3,336,159 A    8/1967   Liebson
4,046,618 A    9/1977   Chaudhari et al.
(Continued)

FOREIGN PATENT DOCUMENTS

JP    07240531 A      9/1995
JP    2004091293 A    3/2004
(Continued)

OTHER PUBLICATIONS

Bauer, Phys. Stat. Sol. (a) 1977, 39, 411.*
(Continued)

*Primary Examiner* — Marla D McConnell
*Assistant Examiner* — Sadie White
(74) *Attorney, Agent, or Firm* — Lathrop & Gage LLP (57) ABSTRACT

A method for forming single crystal or large-crystal-grain thin-film layers deposits a thin-film amorphous, nanocrystalline, microcrystalline, or polycrystalline layer, and laser-heats a seed spot having size on the order of a critical nucleation size of the thin-film layer. The single-crystal seed spot is extended into a single-crystal seed line by laser-heating one or more crystallization zones adjacent to the seed spot and drawing the zone across the thin-film layer. The single-crystal seed line is extended across the thin-film material layer into a single-crystal layer by laser-heating an adjacent linear crystallization zone and drawing the crystallization zone across the thin-film layer. Photovoltaic cells may be formed in or on the single-crystal layer. Tandem photovoltaic devices may be formed using one or several iterations of the method. The method may also be used to form single-crystal semiconductor thin-film transistors, such as for display devices, or to form single-crystal superconductor layers.

21 Claims, 4 Drawing Sheets

(51) Int. Cl.
*H01L 31/076* (2012.01)
*H01L 31/18* (2006.01)

(52) U.S. Cl.
CPC .............. *Y02E10/546* (2013.01); *Y02E 10/548* (2013.01); *Y02P 70/521* (2015.11)

(56) References Cited

U.S. PATENT DOCUMENTS

| | | | |
|---|---|---|---|
| 4,330,363 A * | 5/1982 | Biegesen et al. | 117/54 |
| 5,893,948 A | 4/1999 | Nickel et al. | |
| 2002/0018870 A1 * | 2/2002 | Meinders et al. | 428/64.4 |
| 2004/0192013 A1 * | 9/2004 | Ryu et al. | 438/478 |
| 2004/0231590 A1 * | 11/2004 | Ovshinsky | 118/718 |
| 2008/0293224 A1 * | 11/2008 | Son et al. | 438/487 |
| 2010/0024865 A1 * | 2/2010 | Shah et al. | 136/244 |

FOREIGN PATENT DOCUMENTS

| | | |
|---|---|---|
| JP | 2004273886 A | 9/2004 |
| WO | 9913136 A1 | 3/1999 |

OTHER PUBLICATIONS

Chimmalgi, et al., Nano Letters, 2005, vol. 5, pp. 1924-1930.*
International Search Report and Written Opinion in related PCT Application PCT/US2013/021035, Apr. 29, 2013, 13 pages.

* cited by examiner

METHOD OF FORMING SINGLE-CRYSTAL SEMICONDUCTOR LAYERS AND PHOTOVALTAIC CELL THEREON

RELATED APPLICATIONS

This application claim priority to U.S. Provisional Patent Application Ser. No. 61/590,660, filed Jan. 25, 2012, the disclosure of which is incorporated herein by reference.

BACKGROUND

Photovoltaic (PV) cells are made of many materials. Among common PV cells are those having active photon-absorber layers of polycrystalline Silicon, Single-crystal silicon, or amorphous silicon; photovoltaic cells may be made from other semiconductor materials such as Germanium, Gallium Arsenide, Gallium Phosphide, Indium Gallium Phosphide, Cadmium Telluride, Copper-Indium Gallium diSelenide (CIGS), Copper Oxide, Zinc Oxide, $Zn_3P_2$, and Indium Gallium Nitride.

It is well known that PV cells having absorber layers of single-crystal or large-crystal-grain semiconductors are more efficient at converting energy from incident photons into electrical energy than those of polycrystalline, microcrystalline, nanocrystalline, or amorphous materials due to less material defects. Here "single crystal" means the entire semiconductor material has the same crystallographic orientation without any grain boundaries. "Large-crystal-grain" means that the grain size is comparable or larger than the carrier diffusion length such that electron-hole recombination at grain boundaries is negligible. For example, single-crystal silicon cells are typically as much as twice as efficient as polycrystalline or amorphous silicon cells. However, single crystal materials are significantly more expensive than their polycrystalline, microcrystalline, nanocrystalline, or amorphous counterparts, which is a limiting factor for their applications.

Most single-crystal silicon PV cells available today are made from silicon wafers produced by growing large, single-crystal, boules using the Czochralski process, and sawing slices, or wafers, from the boule. The wafers are then polished and the photovoltaic device formed on and in the wafer. This process is considerably more expensive than forming polycrystalline, microcrystalline, or amorphous thin-film layers on a substrate such as glass. Single crystal wafers of other semiconductor materials are even more expensive than single crystal Si wafers. For example, GaAs wafers are several times more expensive than Si wafers with the same area. For some semiconductor materials such as CIGS, single crystal wafers are unavailable. Furthermore, since sawn wafers have a minimum practical thickness and material is lost from sawing, over 100 times more semiconductor material is typically required to create PV cells of a particular surface area from Czochralski wafers than from thin-films. In addition, the sawing and polishing process is expensive, and wafers tend to be stiff and brittle. Although new technologies such as direct wafer casting from molten Si are being developed to reduce material wastes associated with sawing, the wafers produced are multicrystalline instead of single-crystal. Moreover, the direct wafer casting technique is still unlikely to catch up with the low cost of thin-film layers since the wafers are still about 100 times thicker than thin-films while the material growth temperature is nearly 1000° C. higher.

Layers of polycrystalline, amorphous, and microcrystalline silicon and other semiconductor materials may be deposited on a substrate by various versions of chemical vapor deposition (CVD) and physical vapor deposition (PVD), including plasma-enhanced CVD (PECVD), low pressure CVD (LPCVD), atmosphere pressure CVD (APCVD), ultra-high vacuum CVD (UHV-CVD), thermal evaporation, electron-beam evaporation, sputtering, and laser ablation. Techniques for depositing polycrystalline silicon are well known in the integrated circuit art. Polycrystalline silicon can be deposited on a large variety of substrates, ranging from metal foils to some kinds of glasses, and may also be deposited over conductive metal films previously deposited on some glasses and similar substrates.

Amorphous, nanocrystalline or microcrystalline silicon layers may be deposited on substrates having softening temperatures of less than 600 C; laser recrystallization has been performed on such layers to produce polycrystalline silicon layers at relatively low-temperature on polyester substrates.

As previously mentioned, PV cells fabricated from single-crystal or large-grained silicon wafers are twice as efficient yet considerably more expensive than those made with polycrystalline or amorphous silicon thin films. Further, cells fabricated from Czochralski wafers are fragile, and are usually packaged in inflexible, heavy, and bulky panels for use in fixed solar panel arrays.

Single-crystal thin-films are an alternative approach to high efficiency PV cells. Conventionally, single-crystal thin films have been grown on single crystal substrates or template layers by epitaxy. However, inexpensive, non-single-crystal substrates such as glass, plastics or metal make it impossible to form single-crystal thin films by conventional epitaxial growth due to lack of single crystal substrate or template. For example, glass and plastics are amorphous, while metals are polycrystalline. Thin films deposited on these substrates are also amorphous, microcrystalline or polycrystalline since there is nothing to guide the crystallographic orientation of thin film growth. An approach to form single-crystal thin-films on non-single-crystal substrates or templates is wafer bonding using a "Smart Cut" process, a technique involving surface oxidation, hydrogen implantation into the single crystal Si wafer, bonding to the desired substrate at high temperatures, and annealing to separate a thin layer of Si from the original single crystal Si wafer. This process is very expensive and cannot be scaled to large area due to the limitation of Si wafer size (currently 12 inch in diameter). In fact, the resulting product such as silicon-on-insulator (SOI) is about 10 times more expensive than single-crystal Si wafers themselves. As a result, they are currently only used for high-end electronics and optoelectronics devices. Clearly, this approach is not applicable to high volume solar cell applications.

SUMMARY

In an embodiment, a method for forming a single crystal or large-crystal-grain thin-film layer uses a thin-film amorphous, nanocrystalline, microcrystalline, or polycrystalline layer deposited on a substrate or template, and laser-heats a seed spot having size on the order of a critical nucleation size of the thin-film layer. The single-crystal seed spot is then extended into a single-crystal seed line by laser-heating at least one crystallization zone adjacent to the seed spot and drawing the crystallization zone across the thin-film layer. The single-crystal seed line is then extended across the thin-film layer into a single crystal plane by laser-heating a crystallization zone adjacent to the seed line and drawing the crystallization zone across the thin-film layer.

In an embodiment, a method of fabricating a photovoltaic device involves depositing an electrical contact layer on a substrate or template, and depositing a thin-film semiconductor layer with an initial microstructure selected from the group consisting of amorphous, nanocrystalline, and microcrystalline. A seed spot of the semiconductor layer is laser-heated to a crystallization temperature, the seed spot having size on the order of a critical size of nucleation of the thin-film semiconductor layer, and nucleates into a single-crystal seed. The single-crystal seed spot is extended into a single-crystal seed line by laser-heating at least one crystallization zone adjacent to the seed spot and drawing the crystallization zone across the thin-film semiconductor layer. The single-crystal seed line is then extended across the thin-film semiconductor layer into a single crystal plane by laser-heating a linear crystallization zone adjacent to the seed line and drawing the crystallization zone across the thin-film semiconductor layer. A second electrical contact layer is added, and one of the first and second contact layers may be patterned.

In another embodiment, a method of fabricating a tandem PV cell includes depositing an electrical contact layer on a transparent substrate, depositing a thin-film semiconductor layer having initial microstructure selected from amorphous, nanocrystalline, and microcrystalline, and further having at least a first junction sublayer and a second junction sublayer, each junction sublayer further having a P-type, an Intrinsic, and an N-type sub-sublayer. A seed spot of the thin-film semiconductor layer is then laser-heated to a crystallization temperature, the seed spot having size on the order of a critical size of nucleation of the thin-film semiconductor layer, and thereby nucleates into a single crystal seed. The single crystalline seed spot is extended into a single-crystal seed line by laser-heating at least one crystallization zone adjacent to the seed spot and drawing the crystallization zone across the thin-film semiconductor layer. The single-crystal seed line is then extended across the thin-film semiconductor layer into a single-crystal plane by laser-heating a linear crystallization zone adjacent to the seed line and drawing the crystallization zone across the thin-film semiconductor layer, the crystallization zone crystallizing at least the intrinsic sub-sublayer of the second junction sublayer without crystallizing at least the intrinsic sub-sublayer of the first junction sublayer. A second electrical contact layer is applied.

A photovoltaic device as such may be formed by the method having a first junction and a second junction, the first and second stacked, the first and second junction formed in a chemically same semiconductor material, the first semiconductor junction having amorphous structure and the second semiconductor junction having single crystalline structure.

In another embodiment, a method of forming a tandem photovoltaic device includes depositing a first electrical contact layer on a substrate or template. A first thin-film semiconductor layer of a first semiconductor is deposited having an initial microstructure selected from the group consisting of amorphous, nanocrystalline, and microcrystalline. A seed spot of the first thin-film semiconductor layer is laser-heated to a crystallization temperature, the seed spot having size on the order of a critical size of nucleation of the first thin-film semiconductor layer, and nucleating into a single-crystal seed. The single-crystal seed spot is extended into a single-crystal seed line by laser-heating at least one crystallization zone adjacent to the seed spot and drawing the crystallization zone across the first thin-film semiconductor layer. The single crystalline seed line is then extended across the first thin-film semiconductor layer into a single crystal plane by laser-heating a crystallization zone adjacent to the seed line and drawing the crystallization zone across the thin-film semiconductor layer. At least a second thin-film semiconductor layer is deposited, the second thin-film semiconductor layer chemically different from the first semiconductor layer. More thin-film semiconductor layers with different chemical compositions can be sequentially deposited. Junctions are formed at each thin-film semiconductor layers, and a second electrical contact layer is added. The electrical contact layers may be patterned.

DETAILED DESCRIPTION OF THE EMBODIMENTS

To achieve single crystal or large-crystal-grain thin film semiconductor layers on non-single-crystal substrates or templates, the key is to control the number of nuclei during the crystallization process. For single crystal thin film growth, there has to be only one nucleus formed on the substrate, and the rest of the thin film has to be crystallized from this seed nucleus. For large-crystal-grain thin-film semiconductor layers, the number of nuclei has to be limited such that the total substrate area divided by the number of nuclei is comparable or larger than the carrier diffusion area of electrons and holes in the semiconductor material. During the nucleation process, there is a critical size for nucleation, below which no stable nucleus can be formed. Therefore, when the initial crystallization process is localized to a small area in the same order as the critical nucleation size, only one nucleus can be formed. Using this single nucleus as the seed for the crystallization of the rest of the thin-film, a single-crystal thin film is achieved on non-single-crystal substrates or templates. Our invention describes a new technology based on this approach, which is applicable to manufacturing high efficiency thin-film solar cells as well as SOIs at low cost.

Figure 1:
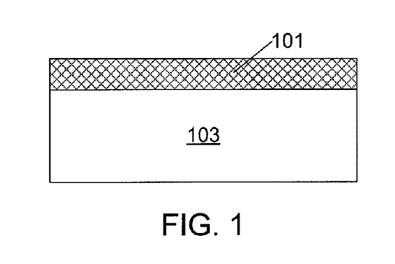
FIG. 1 is a cross sectional illustration of an amorphous, nanocrystalline, microcrystalline, or polycrystalline semiconductor layer on a, non-single-crystal substrate or template.

An amorphous, nanocrystalline, microcrystalline, or polycrystalline thin-film layer 101 is fabricated 202 (FIG. 8) on a substrate or template 103 (FIG. 1) using one of a variety of techniques such as evaporation, sputtering, laser ablation, or chemical vapor deposition. In a particular embodiment thin-film layer 101 is an amorphous silicon layer; in an alternative embodiment semiconductor layer 101 is a microcrystalline silicon layer. In alternative embodiments, thin-film layer 101 may be made of another semiconductor material such as Ge, GaAs, GaP, InGaP CdTe, CIGS, CuO, $Cu_2O$, ZnO, $Zn_3P_2$, or InGaN. In other alternative embodiments, thin-film layer 101 may be made of a superconductor material such as yttrium barium copper oxide (YBCO) or magnesium diboride ($MgB_2$) for use in superconducting devices. The substrate is typically a non-single-crystal material such as glass, plastic, metal or ceramic. A template layer is typically a non-single-crystal material such as a silicon oxide $SiO_x$ ($x \leq 2$), a silicon nitride $SiN_x$ ($x \leq 1.33$), silicon oxy-nitride SiON, amorphous silicon (a-Si), or a similar material. In some embodiments, an electrically conductive contact layer, which in some variations is patterned, may be deposited on the substrate and beneath the semiconductor layer.

Figure 2:
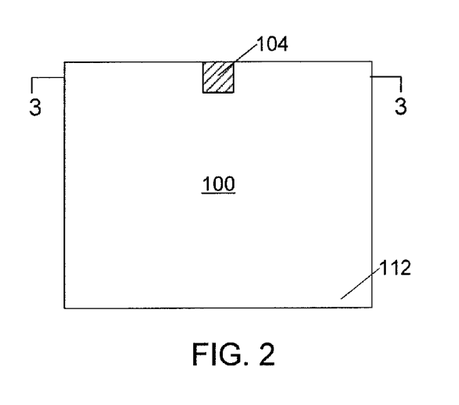
FIG. 2 is a top view of a semiconductor coating on the substrate or template, showing an initial laser focal point and corresponding seed spot for nucleation.

A laser beam is focused at the amorphous or microcrystalline layer to heat selected portions of the film at an initial focal point, at which a single-crystal seed spot 104 is to be formed. In a particular embodiment, the laser is configured to heat the illuminated or heated region at focal point 104 of the amorphous semiconductor layer to a sufficiently high temperature that layer 101 undergoes crystal nucleation and growth in the heated region under laser illumination. In an alternative embodiment, a laser-treated region of a microcrystalline or polycrystalline semiconductor layer is heated by the laser to a temperature where previously existing grain boundaries vanish to allow re-nucleation and recrystallization.

All materials have a critical nucleation zone size for crystallization. The critical nucleation zone size is dependent on the material and temperature. For heated volumes below the critical nucleation zone size, the surface energy required at a boundary between a crystal nucleus and surrounding non-crystallized material is sufficiently large that crystallization is inhibited, and a crystal nucleus is thermodynamically unstable. For heated volumes above the critical nucleation zone size, the surface energy of boundary between crystal nucleus and surrounding non-crystallized material can no longer dominate the energy release from crystallizing material, such that a crystal nucleus becomes thermodynamically stable and, once a nucleus forms, the nucleus will grow since crystal growth further reduces the energy of the system. Typically, a nucleation zone size will range from one to one thousand nanometers in diameter depending on the particular thin-film material and the substrate.

Figure 3:
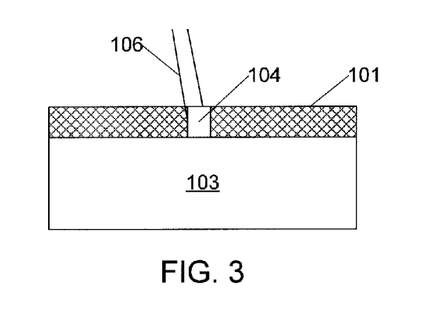
FIG. 3 is a cross sectional illustration of an initial phase in forming a seed line by heating and nucleating a seed spot in the semiconductor coating, taken at 3-3 in FIG. 2.

A focused laser beam 106 or beams from the laser is initially aimed to heat 204, and crystallizes a single seed spot 104 (FIGS. 2 and 3); the seed spot is sized comparable to the critical size of nucleation, i.e., within the same order of magnitude. In a particular embodiment, the seed spot size is not more than twice the critical size of nucleation. Because the seed spot is too small to support more than one nucleation site, under these conditions the seed spot nucleates as a single crystal seed.

For materials where the critical size of nucleation is below one hundred nanometers, a near-field optical focusing technique, such as metal-coated tapered optical fiber, can be applied to achieve a focal spot, and hence seed spot, size of less than one hundred nanometers diameter. For larger critical sizes of nucleation, and required laser spot sizes, the laser may be an infrared CO2 laser. For materials with smaller critical sizes of nucleation the laser may have a shorter wavelength. The laser providing beam 106 can be a continuous-wave laser or may be a pulsed laser with pulse duration between fifty femtoseconds and one hundred microseconds. The peak power density should be greater than ten watts per square centimeter.

Figure 3A:
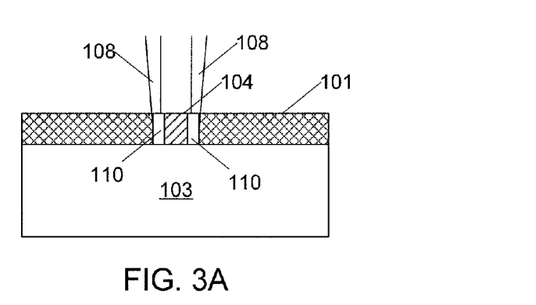
FIG. 3A is a cross sectional illustration of an intermediate phase in forming a seed line in the semiconductor coating.
Figure 4:
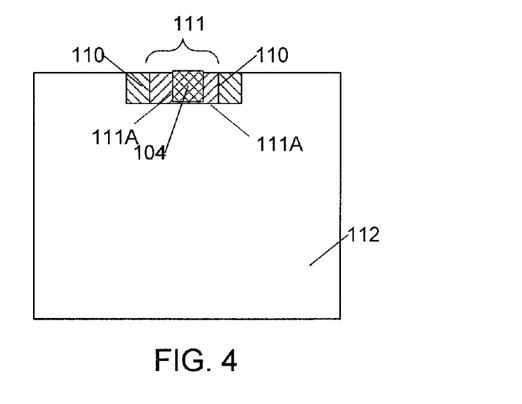
FIG. 4 is a top view illustration of an intermediate phase in forming a seed line in the semiconductor coating.

After the nucleation of the single crystal seed spot 104, the laser is redirected (FIGS. 3A and 4) as two beams 108, each heating a lateral crystallization zone 110 adjacent to the seed spot 104. The crystallization zones 110 are collinear with the seed spot 104, as the laser or lasers are further redirected to shift crystallization zone 110 laterally away from the seed spot 104 each of the crystallization zones leaves behind a single crystal half seed line 111A that is surrounded by untreated material 112, the half-seed lines 111A together with the seed spot 104 forming a single-crystal seed line 111. Since the crystallization zones 110 are kept at or below the critical size of nucleation, and the beam moves laterally away from the seed spot 104, crystallization in zones 110 extends 206 the single crystal seed spot 104 into a single-crystal seed line 111 having the same crystal orientation as the original seed spot.

In an alternative embodiment, a single laser beam heats a lateral crystallization zone adjacent to, and on a first side of, the seed spot 104. Heating from the beam forms a single crystallization zone, that is then drawn away from the seed spot leaving half a single-crystal seed line behind. The laser is then redirected to heat a second crystallization zone adjacent to, and located adjacent the seed spot opposite the first crystallization zone, and similarly drawn away from the seed spot leaving a second half single-crystal seed line. The two half-seed lines 111A are collinear with the seed spot 104, and, together with seed spot 104, form a full single crystal seed line 111 surrounded by untreated material 112.

In another alternative embodiment, the seed spot 104 is located at an edge of the amorphous or microcrystalline layer. A single laser beam heats a lateral crystallization zone adjacent to, and on a side of, the seed spot 104. Heating from the beam forms a single crystallization zone, that is then drawn away from the seed spot towards the opposite edge of the amorphous or microcrystalline layer, leaving behind a single-crystal seed line 111 surrounded by untreated material 112. The single-crystal seed line 111 has the same crystal orientation as, and includes, the original seed spot 104. In a particular embodiment, a laser beam is swept at uniform rate onto, then across, the amorphous or microcrystalline layer, the seed spot 104 is formed as the beam sweeps onto the layer, the lateral crystallization zone as the beam shifts adjacent to the seed spot, and single-crystal seed line 111 forms and extends across the layer behind the beam.

Figure 5:
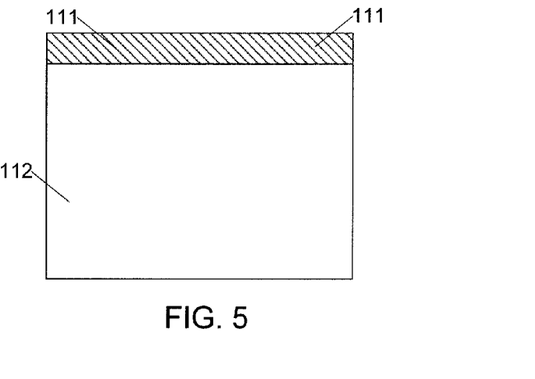
FIG. 5 illustrates a top view of the seed line prior to extension of single-crystal growth across the remaining semiconductor layer.

In each embodiment, the laser sweep is adjusted (FIG. 4) to move the lateral crystallization zones 110 away from the single-crystal seed line zone 111. Thus, the single crystal seed line zone 111 is extended laterally. The sweep is continually adjusted with the lateral extension zones moving towards edges of the coated substrate until the lateral crystallization zones 110 pass outside the coated substrate. This step forms a single-crystal seed line 111 (FIG. 5) extending across the coated substrate.

Figure 6:
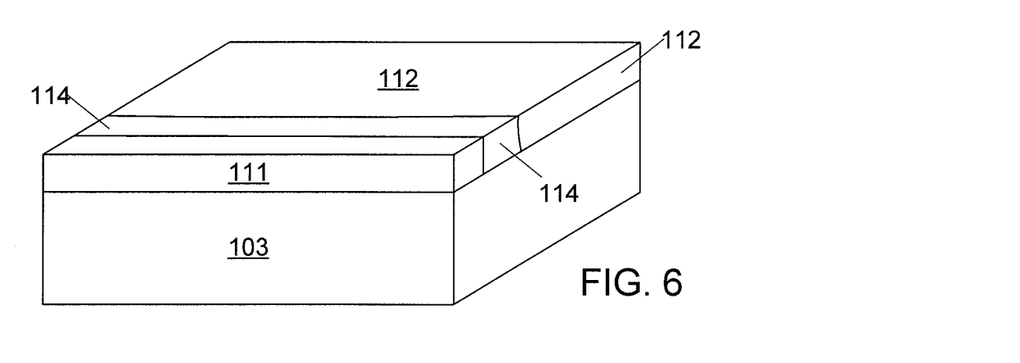
FIG. 6 illustrates a perspective view of heated crystallization zone adjacent to the seed line.
Figure 7:
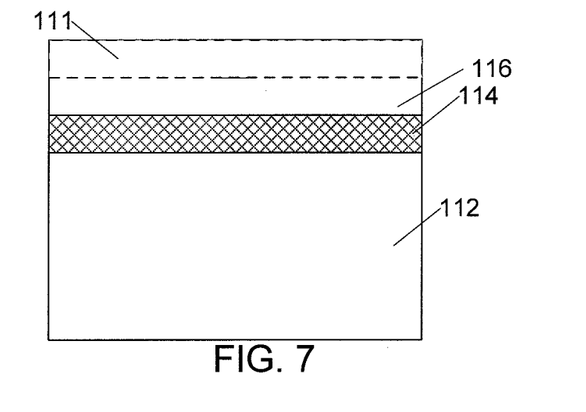
FIG. 7 illustrates sweeping the heated crystallization zone away from the seed line and across the remaining semiconductor layer on the substrate (top view).

Next, as illustrated in FIG. 6 and FIG. 7, the laser beam is adjusted into a line focus that is used to heat 208 a linear heated crystallization zone having shape of a line 114 directly adjacent to and overlapping, but not melting, the seed line 111. In an alternative embodiment, the laser beam that heats linear crystallization zone 114 is provided by a second laser. In a particular embodiment, a cylinder lens is used to diverge the laser beam to heat this linear region.

In a manner similar to the lateral sweep of the heated crystallization zone, the heated linear crystallization zone 114 is swept perpendicular to, and away from, the single crystal seed line 111 across the untreated material 112 in a direction perpendicular to the seed line 111. Since the laser is directed such that further crystallization is seeded by single-crystal seed line 111, the single-crystal zone 116 now expands into a sheet or layer behind heated crystallization zone 114. This sweep is continued until the entire untreated amorphous or microcrystalline layer 112 has been consumed and single crystal zone 116 expands to cover the entire coated substrate. After the entire substrate passes through the laser line, or the laser line passes over the entire substrate, the crystallization is completed and the initial thin film is converted to a single-crystal thin film 116 (FIG. 7A).

In an embodiment the sweep of FIG. 7 is performed optically by moving laser beams; in an alternative embodiment the substrate is moved under a stationary laser and optical system at a rate of between one micron and ten millimeters per second determined by available laser power, the particular thin-film material, width of the coated substrate, and similar factors.

Figure 7A:
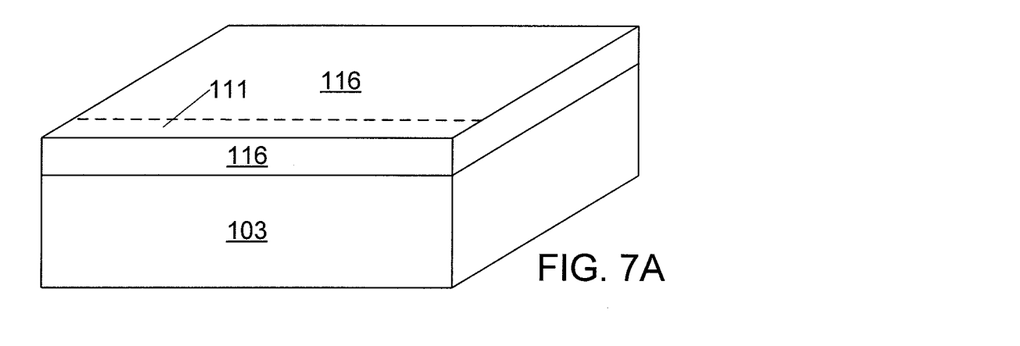
FIG. 7A is a perspective view illustrating a completed crystallized single-crystal layer.

After the entire substrate passes through the laser line, the crystallization is completed and the initial amorphous or microcrystalline thin film 101 is converted to a single-crystal thin film 116, as shown in FIG. 7A.

If the starting thin-film material 101 is microcrystalline instead of amorphous, large-crystal-grain semiconductor film can be achieved using the approach described above, although complete single-crystal growth may not be feasible since there are already many tiny crystalline grains in the material.

Once the thin-film material has been crystallized, or recrystallized if the starting thin-film is microcrystalline, a solar cell is fabricated 210 in the crystallized material using techniques known in the art. In embodiments, these techniques involve forming a junction by diffusing dopants into the crystallized material, growing an epitaxial layer of opposite polarity on top of the crystallized material, or depositing a heterojunction partner layer, as appropriate for the semiconductor material; in embodiments they further include adding a top contact conductor or metallization to provide electrical contact to a top of the junction.

In a particular embodiment, the method herein described is applied to crystallize a thin-film layer of amorphous silicon into single-crystal silicon.

Figure 9:
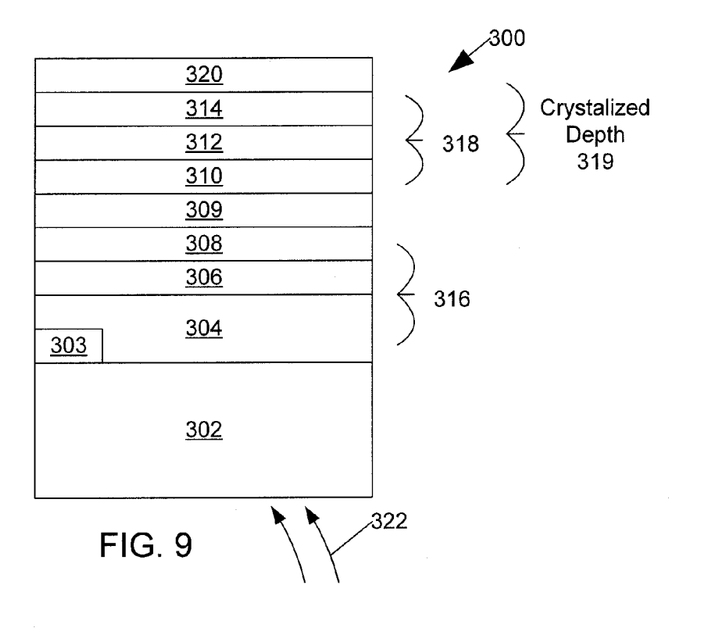
FIG. 9 is a cross-sectional diagram illustrating a tandem photovoltaic device having stacked crystallized and amorphous cells, the cells having distinct bandgaps and fabricated in a single semiconductor material.

The disclosed technology can also be applied to fabricated tandem solar cells, 300 as illustrated in FIG. 9. In one embodiment, amorphous silicon layers with two in-situ doped p-i-n junction structures is deposited on a transparent substrate 302.

The cell of FIG. 9 is constructed by depositing a layer or grid of low-resistance electrical contact 303 on the substrate 302, then depositing a P-type amorphous-silicon layer 304, an intrinsic (I) silicon absorber layer 306, and an N-type amorphous-silicon layer 308. In some embodiments, an ohmic-contact layer 309 may then be deposited. Another P-type amorphous-silicon layer 310, intrinsic silicon absorber layer 312, and N-type amorphous-silicon layer 314 are then deposited. The first-deposited P-I-N layers 304, 306, 308 form a first, bottom, junction 316, and the second-deposited P-I-N layers 310, 312, 314 form a second, top, junction 318, The two junction structures 316, 318, are vertically stacked. In an alternative embodiment, the N-type and P-type layers here described are swapped, such that each cell has its N-type amorphous layer deposited before its P-type layer.

The structure therefore has a layer of thin-film semiconductor material that is formed of N, P, and I sublayers.

We then choose a laser wavelength such that the beam's penetration depth is smaller than the total thickness of the amorphous silicon thin films and comparable to the total thickness of the top junction 318. Crystallization as above described is then performed. Since the heated crystallization zones 104, 110 and 114 only penetrate and heat the top junction 318 and heating is fast enough that heat fails to penetrate deeper into the films such that crystallization depth 319 includes only layers of the top junction, and the laser fails to heat the bottom junction sufficiently to cause crystallization in the lower junction 316, only the top layers and associated junction are converted into single crystal Si, while the bottom junction remains amorphous Si. The step of extending 208 the single-crystal seed line into a single-crystal sheet or layer therefore converts only some sublayers of the layer into single-crystal form. Following the crystallization, a back-contact metallization layer 320 is added to complete the device.

Since amorphous Si has a larger band gap than single-crystal Si, the structure constitutes a tandem solar cell. Sunlight 322 is illuminated from the backside of the transparent substrate in this case.

Figure 10:
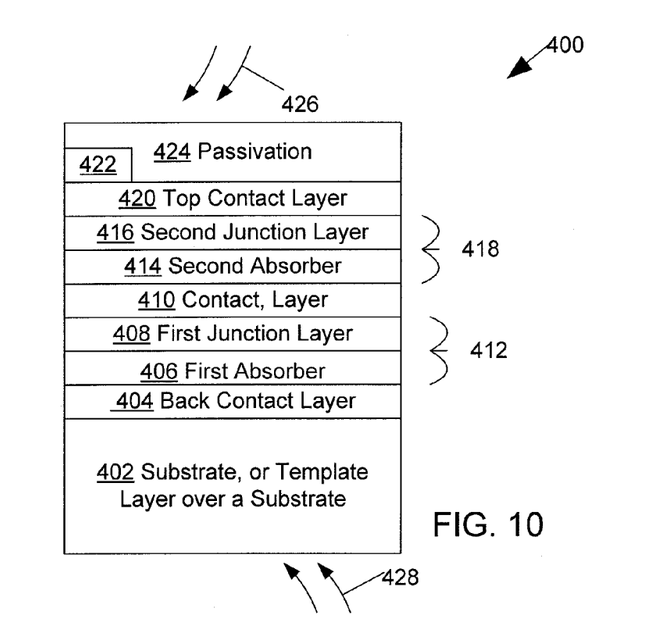
FIG. 10 is a cross-sectional diagram illustrating an alternative tandem photovoltaic device having crystallized cells of differing semiconductor materials with distinct bandgaps.

In another alternative embodiment of a tandem photovoltaic device 400, as illustrated in FIG. 10, a back-contact layer 404 is deposited on a substrate 402. The contact layers herein described are typically transparent, conductive, metal oxide layers, such as but not limited to indium-tin-oxide, zinc oxide, or tin oxide, where transparency is required, or metal layers where transparency is not required. Contact layers may also be heavily-doped layers of semiconductor material. A first semiconductor absorber layer 406 formed of a first semiconductor material is deposited on the back-contact layer, followed by a junction layer 408, or a heterojunction partner layer, as appropriate for solar cells fabricated from the first semiconductor material. The absorber 406 and junction layers 408 together form a first junction 412. In some embodiments, a contact layer 410, and/or a diffusion barrier layer, is then applied to ensure ohmic conduction between the first junction layer 408 and a second absorber layer 414, formed of a second semiconductor material. A second junction layer 416, or a second heterojunction partner layer, as appropriate for solar cells fabricated from the second semiconductor material, is next deposited, the second absorber layer 414 and junction layer 416 form a second junction 418; since the semiconductor materials of the first 412 and second 418 junctions differ, these junctions have differing band gaps and spectral sensitivities.

An electrical conductor layer 420 is deposited over the second junction layer. In some embodiments a grid 422 of conductive metal is formed over the conductor layer 420. At least one of the conductor layers 404 and 420 should be transparent. A passivation or protection layer 424 may be added atop the device. The device 400 will function as a tandem photovoltaic device when exposed to light 426. When the band gaps of the absorber layers from bottom to top are arranged from small to large, the light 426 should be illuminated from the top. Conversely, when the band gaps of the absorber layers from bottom to top are arranged from large to small, the light 428 should be illuminated from the bottom, and the substrate 402 as well as the contact layer 404 should be transparent in this case. Variant embodiments may have additional layers, such as diffusion barrier layers, that are not shown herein. Further, variant embodiments not illustrated herein may have additional layers forming a third or more junction layers of a third or more semiconductor materials. It is anticipated that various embodiments may make use of two, or more, chemically-different semiconductor materials selected from the group consisting of Silicon, Germanium, Gallium Arsenide, Gallium Phosphide, Indium Gallium Phosphide, Cadmium Telluride, Copper Indium Gallium diSelenide, Cupric or Cuprous Oxide, Zinc Oxide, Zinc Phosphide, or Indium Gallium Nitride. The band gaps of the multiple semiconductor absorber layers in the stack should be arranged from large to small, either from top to bottom or bottom to top.

Figure 8:
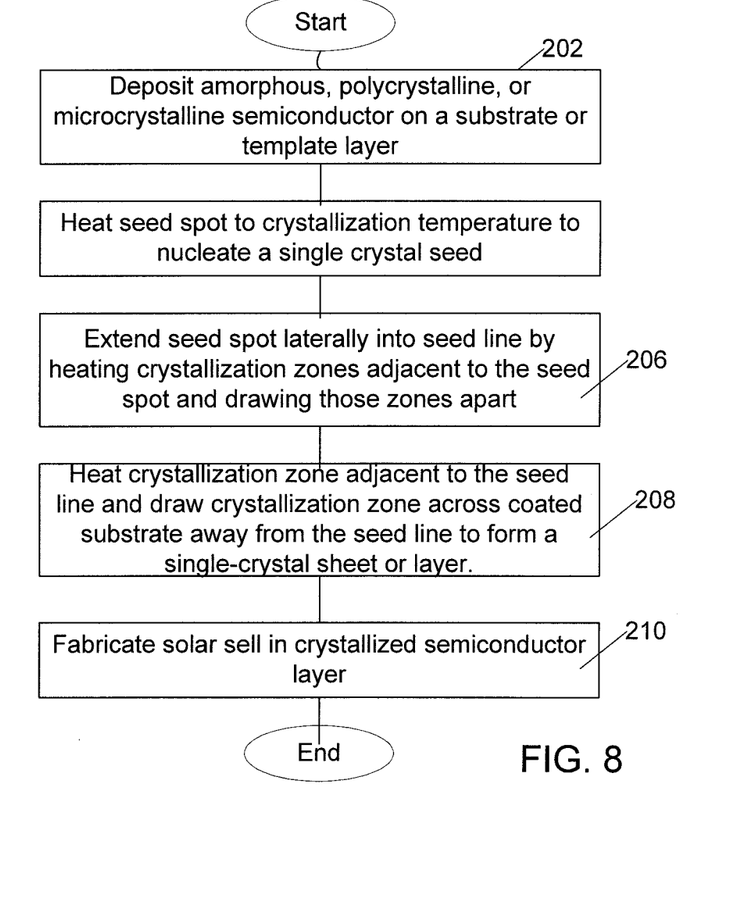
FIG. 8 is a flowchart of the method of crystallizing a thin-film material.

In an embodiment of the device 400, where the first semiconductor material requires higher temperatures or smaller spot sizes for crystallization than those required by the second semiconductor material, or where the second semiconductor material is unstable at temperatures required for crystallization of the first material, crystallization as above described with reference to FIG. 8 of the first semiconductor material is performed after deposition of first junction layer 408 and prior to deposition of second absorber layer 414 in order to convert the first junction 412 into single crystal layers. In this embodiment, crystallization of the second semiconductor material may then be performed after deposition of the second junction layer 416 by repeating the process described with reference to FIG. 8 with a laser spot size chosen appropriate to the critical size of nucleation of the second junction layer in order to convert the second junction 418 into single crystal layers. In an alternative embodiment, before depositing top conductor layer 420, a third absorber layer (not shown) of a third semiconductor material, chemically different from both the first and second semiconductor materials, is deposited with appropriate contact, barrier, and junction layers, to form a third junction atop the second junction 418; the third absorber layer may be crystallized by again repeating the process described with reference to FIG. 8 with a laser spot size chosen appropriate to the critical size of nucleation of the third junction layer.

In an embodiment of the device 400 where both semiconductor materials can be crystallized at similar temperatures and crystallization-zone spot sizes, both materials are crystallized in a single pass of the crystallization process described with reference to FIG. 8 in order to convert the semiconductor absorber layers of both junctions of the entire stack 412 and 418 into single crystal layers.

In another embodiment, the single-crystal semiconductor layer 116 achieved is used as a template layer to grow tandem cells by epitaxy. In this case no single-crystal substrate is needed so that the fabrication cost is greatly reduced over devices based on Czochralski-process wafers. Furthermore, the material and composition of single-crystal thin film layer 116 can be selected to match the lattice constants of other desired semiconductor materials in the tandem cell structure to minimize defect density. Such materials or composition may or may not be available in the form of single-crystal wafers.

The herein described method of crystallizing materials as applied to semiconductor materials is useful for fabricating both single-junction and tandem, stacked-junction, solar cells as herein described. The method of crystallizing materials, as applied to semiconductor materials, is also applicable to producing single-crystal thin films for use in electronic applications where insulating, or transparent, non-single-crystal substrates are necessary or desirable. Such electronic applications may include high-performance display devices or panels, where metal-gate or polysilicon-gate metal-oxide-semiconductor (MOS) transistors having single-crystal channel, source and drain produced in single-crystal thin films, the single-crystal thin films produced according to the herein described method, may prove advantageous over the conventional thin-film transistors currently used for pixel selection and on-panel decoding.

The herein described method of crystallizing materials is also expected to be useful for producing single-crystal thin films of materials such as MgB2 and YBCO.

While the invention has been particularly shown and described with reference to particular embodiments thereof, it will be understood by those skilled in the art that various other changes in the form and details may be made without departing from the spirit and scope of the invention. It is to be understood that various changes may be made in adapting the invention to different embodiments without departing from the broader inventive concepts disclosed herein and comprehended by the claims that follow

What is claimed is:

1. A method for forming a single-crystal thin-film material layer of a first material comprising:
    depositing a thin-film material layer on a surface selected from a substrate and a template layer on a substrate, the thin-film semiconductor layer having an initial microstructure selected from the group consisting of amorphous, nanocrystalline, microcrystalline, and polycrystalline;
    laser-heating to a crystallization temperature a seed spot in the thin-film material layer between one and one thousand nanometers in diameter of the thin-film material layer, using a laser focal spot size on the order of a critical size of nucleation of the thin-film material layer, the seed spot having size on the order of the critical size of nucleation of the thin-film material layer, and thereby crystalizing the seed spot; the crystallized seed spot consisting of a single crystal seed in the thin-film material layer;
    extending the seed spot into a single-crystal seed line by laser-heating at least one crystallization zone adjacent to the seed spot and drawing the crystallization zone across the thin-film material layer; and
    extending the single crystal seed line across the thin-film material layer by laser-heating a crystallization zone adjacent to the seed line and drawing the crystallization zone across the thin-film semiconductor layer.

2. The method of claim 1 wherein the thin-film material layer comprises a material selected from the group consisting of Silicon, Germanium, Gallium Arsenide, Gallium Phosphide, Indium Gallium Phosphide, Cadmium Telluride, Copper Indium Gallium diSelenide, Cupric or Cuprous Oxide, Zinc Oxide, Zinc Phosphide, and Indium Gallium Nitride.

3. The method of claim 2 wherein the thin-film material has amorphous initial microstructure.

4. The method of claim 2 wherein the thin-film material comprises primarily silicon.

5. The method of claim 4 wherein the thin-film semiconductor material has amorphous initial microstructure.

6. The method of claim 1, wherein said surface is a substrate comprising a non-single-crystal material selected from the group consisting of glass, plastics, metal, or ceramics.

7. The method of claim 1, wherein said surface comprises a template layer comprising a non-single-crystal material from the group consisting of a silicon oxide, silicon nitride, silicon oxynitride, or amorphous silicon.

8. The method of claim 1 wherein the seed spot has size not greater than twice the critical size of nucleation.

9. The method of claim 1 further comprising depositing a second thin-film layer comprising a semiconductor second material chemically different from the first material.

10. The method of claim 9 wherein the step of laser heating is performed after the step of depositing the second semiconductor material, and both the first and second thin-film layers are crystallized during the step of laser heating.

11. The method of claim 9 wherein the step of laser heating is performed prior to depositing the second thin-film layer.

12. The method of claim 11 further comprising:
a second laser heating to form a second seed spot, the second laser heating performed with a laser spot size on the order of a critical size of nucleation of the second thin-film layer;
extending the second seed spot into a second single-crystal seed line in the second thin-film semiconductor layer by laser-heating at least one crystallization zone adjacent to the seed spot and drawing the crystallization zone across the second thin-film layer; and
extending the single crystal seed line across the second thin-film layer by laser-heating a crystallization zone adjacent to the seed line and drawing the crystallization zone across the second thin-film layer.

13. The method of claim 9 further comprising depositing a third thin-film layer of a semiconductor third material chemically different from the first and second materials.

14. The method of claim 13 further comprising:
a third laser heating to form a third seed spot;
extending the third seed spot into a third single-crystal seed line in the third thin-film layer by laser-heating at least one crystallization zone adjacent to the seed spot and drawing the crystallization zone across the third thin-film layer; and
extending the single crystal seed line across the third thin-film semiconductor layer by laser-heating a crystallization zone adjacent to the seed line and drawing the crystallization zone across the third thin-film layer.

15. The method of claim 1 wherein the thin-film semiconductor layer comprises at least a first and a second sublayer, and wherein the step of extending the seed line crystallizes at least the first, but not the second, sublayer.

16. A method of fabricating a photovoltaic device comprising:
depositing an electrical contact layer on a surface;
depositing a first thin-film semiconductor layer, the first thin-film semiconductor layer having an initial microstructure selected from the group consisting of amorphous, nanocrystalline, and microcrystalline;
laser-heating to a crystallization temperature a seed spot of the first thin-film semiconductor layer, the seed spot having size between one and one thousand nanometers diameter and on the order of a critical size of nucleation of the first thin-film semiconductor layer, and thereby crystallizing the first seed spot into a seed consisting of a single crystal, wherein the laser heating of the seed spot is performed with a laser focal spot size on the order of the critical size of nucleation;
extending the seed spot into a first single-crystal seed line by laser-heating at least one crystallization zone adjacent to the seed spot and drawing the crystallization zone across the first thin-film semiconductor layer;
extending the first single crystal seed line across the thin-film semiconductor layer by laser-heating a crystallization zone adjacent to the first seed line and drawing the crystallization zone across the first thin-film semiconductor layer;
constructing a first junction using the first thin-film semiconductor layer; and
applying contact metallization.

17. The method of claim 16 further comprising:
depositing a second thin-film semiconductor layer, the second thin-film semiconductor layer having an initial microstructure selected from the group consisting of amorphous, nanocrystalline, and microcrystalline;
laser-heating to a crystallization temperature a second seed spot of the second thin-film semiconductor layer, the seed spot having size on the order of a critical size of nucleation of the second thin-film semiconductor layer, and thereby crystallizing the second seed spot into a single-crystal seed;
extending the second seed spot into a second single-crystal seed line by laser-heating at least one crystallization zone adjacent to the seed spot and drawing the crystallization zone across the second thin-film semiconductor layer;
extending the second single crystal seed line across the thin-film semiconductor layer by laser-heating a crystallization zone adjacent to the second seed line and drawing the crystallization zone across the second thin-film semiconductor layer;
constructing a second junction using the second thin-film semiconductor layer.

18. A method of fabricating a tandem photovoltaic device comprising:
depositing an electrical contact layer on a transparent substrate;
depositing a thin-film semiconductor layer, the thin-film semiconductor layer having an initial microstructure selected from the group consisting of amorphous, nanocrystalline, and microcrystalline, the thin-film semiconductor layer comprising at least a first junction sublayer and a second junction sublayer, each junction sublayer further comprising a P-type, an Intrinsic, and an N-type sub-sublayer
laser-heating to a crystallization temperature a seed spot of the thin-film semiconductor layer, the seed spot having size between one and one thousand nanometers diameter and on the order of a critical size of nucleation of the thin-film semiconductor layer, and thereby crystallizing the seed spot into a single-crystal seed spot consisting of a single crystal;
extending the single-crystal seed spot into a single-crystal seed line by laser-heating at least one crystallization zone adjacent to the seed spot and drawing the crystallization zone across the thin-film semiconductor layer, the crystallization zone crystallizing at least one sub-sublayer of the second junction sublayer and without crystallizing at least the intrinsic sublayer of the first junction sublayer; and
applying a contact layer;
wherein the laser heating of the seed spot is performed with a laser focal spot size on the order of the critical size of nucleation.

19. A method of forming a tandem photovoltaic device comprising
depositing a first electrical contact layer on a transparent substrate;
patterning an electrical contact layer selected from the group consisting of the first metallic contact layer and a second metallic contact layer;
depositing a first thin-film semiconductor layer, the first thin-film semiconductor layer having an initial microstructure selected from the group consisting of amorphous, nanocrystalline, and microcrystalline;
laser-heating to a crystallization temperature a seed spot of the first thin-film semiconductor layer, the seed spot having size between one and one thousand nanometers diameter and on the order of a critical size of nucleation of the first thin-film semiconductor layer, and thereby crystalizing the seed spot into a single-crystal seed;

extending the seed spot into a single-crystal seed line by laser-heating at least one crystallization zone adjacent to the seed spot and drawing the crystallization zone across the first thin-film semiconductor layer;

depositing a second thin-film semiconductor layer, the second thin-film semiconductor layer chemically different from the first semiconductor layer;

forming a first junction at the first thin-film semiconductor layer;

forming a second junction at the second thin-film semiconductor layer; and applying the second electrical contact layer;

wherein the laser heating of the seed spot of the first thin-film semiconductor layer is performed with a laser focal spot size on the order of the critical size of nucleation.

20. The method of claim 9 wherein the second thin film material is selected from the group consisting of Ge, GaAs, GaP, InGaP CdTe, CIGS, CuO, $Cu_2O$, $Zn3P_2$, and InGaN.

21. A method for forming a single-crystal thin-film material layer of a first material comprising:

depositing a thin-film material layer on a surface selected from a substrate and a template layer on a substrate, the thin-film semiconductor layer having an initial microstructure selected from the group consisting of amorphous, nanocrystalline, microcrystalline, and polycrystalline;

laser-heating to a crystallization temperature a seed spot between one and one thousand nanometers in diameter of the thin-film material layer, using a laser focal spot produced by near-field focusing techniques to produce the seed spot having size on the order of the critical size of nucleation of the thin-film material layer, and thereby crystalizing the seed spot; the crystallized seed spot consisting of a single crystal seed in the thin-film material layer;

extending the seed spot into a single-crystal seed line by laser-heating at least one crystallization zone adjacent to the seed spot and drawing the crystallization zone across the thin-film material layer; and extending the single crystal seed line across the thin-film material layer by laser-heating a crystallization zone adjacent to the seed line and drawing the crystallization zone across the thin-film semiconductor layer.

* * * * *